(12) United States Patent
Abali et al.

(10) Patent No.: US 8,407,410 B2
(45) Date of Patent: Mar. 26, 2013

(54) WEAR-LEVELING AND BAD BLOCK MANAGEMENT OF LIMITED LIFETIME MEMORY DEVICES

(75) Inventors: Bulent Abali, Tenafly, NJ (US); John P. Karidis, Ossining, NY (US); Luis A. Lastras-Montano, Cortlandt Manor, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/445,172

(22) Filed: Apr. 12, 2012

(65) Prior Publication Data

US 2012/0204071 A1    Aug. 9, 2012

Related U.S. Application Data

(62) Division of application No. 12/433,220, filed on Apr. 30, 2009, now Pat. No. 8,255,613.

(51) Int. Cl.
*G06F 12/00* (2006.01)
(52) U.S. Cl. ............................... 711/103; 714/E11.159
(58) Field of Classification Search .................... 714/54, 714/E11.084
See application file for complete search history.

(56) References Cited

U.S. PATENT DOCUMENTS

| | | | |
|---|---|---|---|
| 5,568,423 A | 10/1996 | Jou et al. | |
| 6,895,464 B2 | 5/2005 | Chow et al. | |
| 7,224,607 B2 | 5/2007 | Gonzalez et al. | |
| 7,318,117 B2 | 1/2008 | Lee et al. | |
| 2003/0133333 A1* | 7/2003 | Eldredge et al. | 365/200 |
| 2008/0034154 A1* | 2/2008 | Lee et al. | 711/103 |
| 2009/0198882 A1* | 8/2009 | Ji et al. | 711/109 |
| 2010/0142275 A1* | 6/2010 | Yogev et al. | 365/185.09 |

FOREIGN PATENT DOCUMENTS

WO    WO2008057557    5/2008

OTHER PUBLICATIONS

Gal et al.; Algorithms and Data Structures for Flash Memories; ACM Computing Surveys; vol. 37; No. 2; Jun. 2005; pp. 138-163.

\* cited by examiner

*Primary Examiner* — Edward Dudek, Jr.
*Assistant Examiner* — John P Fishburn
(74) *Attorney, Agent, or Firm* — Cantor Colburn LLP; Dwayne Nelson (57) ABSTRACT

Performing wear-leveling and bad block management of limited lifetime memory devices. A method for performing wear-leveling in a memory includes receiving logical memory addresses and applying a randomizing function to the logical memory addresses to generate intermediate addresses within a range of intermediate addresses. The intermediate addresses are mapped into physical addresses of a memory using an algebraic mapping. The physical addresses are within a range of physical addresses that include at least one more location than the range of intermediate addresses. The physical addresses are output for use in accessing the memory. The mapping between the intermediate addresses and the physical addresses is periodically shifted. In addition, contents of bad blocks are replaced with redundantly encoded redirection addresses.

13 Claims, 5 Drawing Sheets

WEAR-LEVELING AND BAD BLOCK MANAGEMENT OF LIMITED LIFETIME MEMORY DEVICES

CROSS REFERENCE TO RELATED APPLICATIONS

This application is a divisional application of U.S. Ser. No. 12/433,220 filed Apr. 30, 2009, the contents of which are incorporated by reference herein in their entirety.

BACKGROUND

This invention relates generally to computer memory, and more specifically to providing wear-leveling and bad block management of limited lifetime memory devices.

Limited lifetime computer storage devices include, but are not limited to, flash memory (e.g., not-and or "NAND" flash memory, and not-or or "NOR" flash memory), and phase change memory (PCM). Device physics dictate a limited number of writes and/or erasures to the memory cells in these limited lifetime memories. For example, NAND flash memory may have on average $10^5$ write/erase cycles per access unit (e.g., a block that contains several kilobytes). Likewise, PCM devices may last for about $10^8$ writes per block. After a block reaches its end of life it may start giving more data errors, and thus, it should be marked as a bad block and avoided for data storage thereafter.

Typically, some memory addresses (referred to as hotspots) will be busier than others. In general, hot-spot blocks will fail sooner than less busy blocks. Hot spots, if not avoided, can render the entire memory (e.g., one or more memory devices) unusable due to a single bad block. Wear-leveling methods prolong the life of these memories by uniformly distributing writes/erasures across the whole memory such that every block receives an approximately equal number of writes over the lifetime of the whole memory.

Another endurance problem occurs within the unit of access, the block. A block may comprise tens to hundreds of device cells each of which may be storing one bit of data (single-level cell) or a few bits of data (multi-level cell). Each cell within a block may have a different lifetime than others in the same block due to the statistical nature of device manufacturing processes. Thus, cells within a block may fail at different times, rendering the entire block unusable. To help alleviate this problem, error checking and correcting (ECC) techniques are utilized within each memory block. Redundant cells are used in each block to be able to encode data in a variety of manners to recover from cell errors, therefore prolonging the block life. However, there may still be a hotspot problem within the block. For example, it has been observed that on the average, data at the beginning of a memory page are accessed more often than data towards the end of the page.

SUMMARY

An exemplary embodiment is a method for performing wear-leveling in a memory system. The method includes receiving logical memory addresses and applying a randomizing function to the logical memory addresses to generate intermediate addresses within a range of intermediate addresses. The intermediate addresses are mapped into physical addresses of a memory using an algebraic mapping. The physical addresses are within a range of physical addresses that include at least one more location than the range of intermediate addresses. The physical addresses are output for use in accessing the memory. The mapping between the intermediate addresses and the physical addresses is periodically shifted.

Another exemplary embodiment is a method for performing bad block management in a memory system. The method includes detecting a bad block in a memory and redirecting references to the bad block. The redirecting includes storing a redirection address and an indicator bit in the bad block. The indicator bit indicates that the bad block includes the redirection address. The redirection address specifies a memory block containing data intended for the bad block. Memory access requests to the bad block are directed to the redirection address.

An additional exemplary embodiment is a memory system including a memory with one or more limited lifetime memory devices and a wear-leveling module. The wear-leveling module is connected to a processor and to the memory. The wear-leveling module: receives logical memory addresses from the processor; applies a randomizing function to the logical memory addresses to generate intermediate addresses within a range of intermediate addresses; maps the intermediate addresses into physical addresses of the memory using an algebraic mapping, the physical addresses including at least one more location than the range of intermediate addresses; outputs the physical addresses for accessing the memory; and periodically shifts the mapping between the intermediate addresses and the physical addresses.

An additional exemplary embodiment is a memory system that includes a memory of one or more limited lifetime memory devices, and a bad block management module connected to a processor and to the memory. The bad block management module: detects a bad block in the memory; and redirects references to the bad block, the redirecting including storing a redirection address and an indicator bit in the bad block, the indicator bit indicating that the bad block includes the redirection address, the redirection address specifying a memory block containing data intended for the bad block, wherein memory access requests to the bad block are directed to the redirection address.

Additional features and advantages are realized through the techniques of the present embodiment. Other embodiments and aspects are described herein and are considered a part of the claimed invention. For a better understanding of the invention with the advantages and features, refer to the description and to the drawings.

BRIEF DESCRIPTION OF THE SEVERAL VIEWS OF THE DRAWINGS

The subject matter that is regarded as the invention is particularly pointed out and distinctly claimed in the claims at the conclusion of the specification. The foregoing and other features, and advantages of the invention are apparent from the following detailed description taken in conjunction with the accompanying drawings in which:

DETAILED DESCRIPTION

Exemplary embodiments of the present invention minimize bookkeeping complexity while accomplishing wear-leveling, refreshing, and bad-block management of memory devices. Exemplary embodiments implement a combination of wear-leveling and memory scrub/refresh methods using a circular buffer arrangement to determine the logical-to-physical mapping of addresses.

Exemplary embodiments utilize an algebraic mapping (i.e., not a table-based mapping) of block addresses from logical addresses (LAs) to physical addresses (PAs). In exemplary embodiments, the algebraic mapping requires only two registers (e.g., a start register and gap register) to perform the mapping. An advantage of algebraic mapping is the elimination of table-based mapping and its associated disadvantages. Algebraic mapping has virtually no bookkeeping overhead, negligible access delay when the start and gap registers are implemented on chip, and has no space overhead.

Exemplary embodiments also perform "horizontal" wear-leveling (i.e., leveling wear across the bytes of a block) by cycling the "origin" location of the written block (i.e., the most significant bit location) across the group of chips, or memory devices, used to store the block. When the data is written to a new location by shifting the gap location, the starting position can also be shifted one unit/chip to the right. Then, the horizontal starting position can be determined from the contents of a rotate register and the location of the memory reference relative to the gap.

Further exemplary embodiments of the present invention detect bad blocks (e.g., those which can not reliably store a full block worth of information) during normal reads or during scrubbing. The detected bad blocks are written with a short redirection address to a spare block, plus one or more additional bits indicating the length and/or type of the written information. Reads to bad blocks detect the bits indicating that a redirection is required, and then the short but heavily-redundantly encoded address information in the block is used as the redirection address. Exemplary embodiments also reduce the need to read before writing by entering bad block addresses into a fast lookup directory, such as a hardware-based Bloom Filter.

As used herein, the term "logical address" refers to the address of the data that the programmer thinks they are accessing. As used herein, the term "intermediate address" refers to an intermediate representation of the logical address. As used herein, the term "physical address" refers to the actual location where the data is intended to be stored. As used herein, the term "redirection address" refers to a separate address stored into the physical address to point to a different location.

Figure 1:
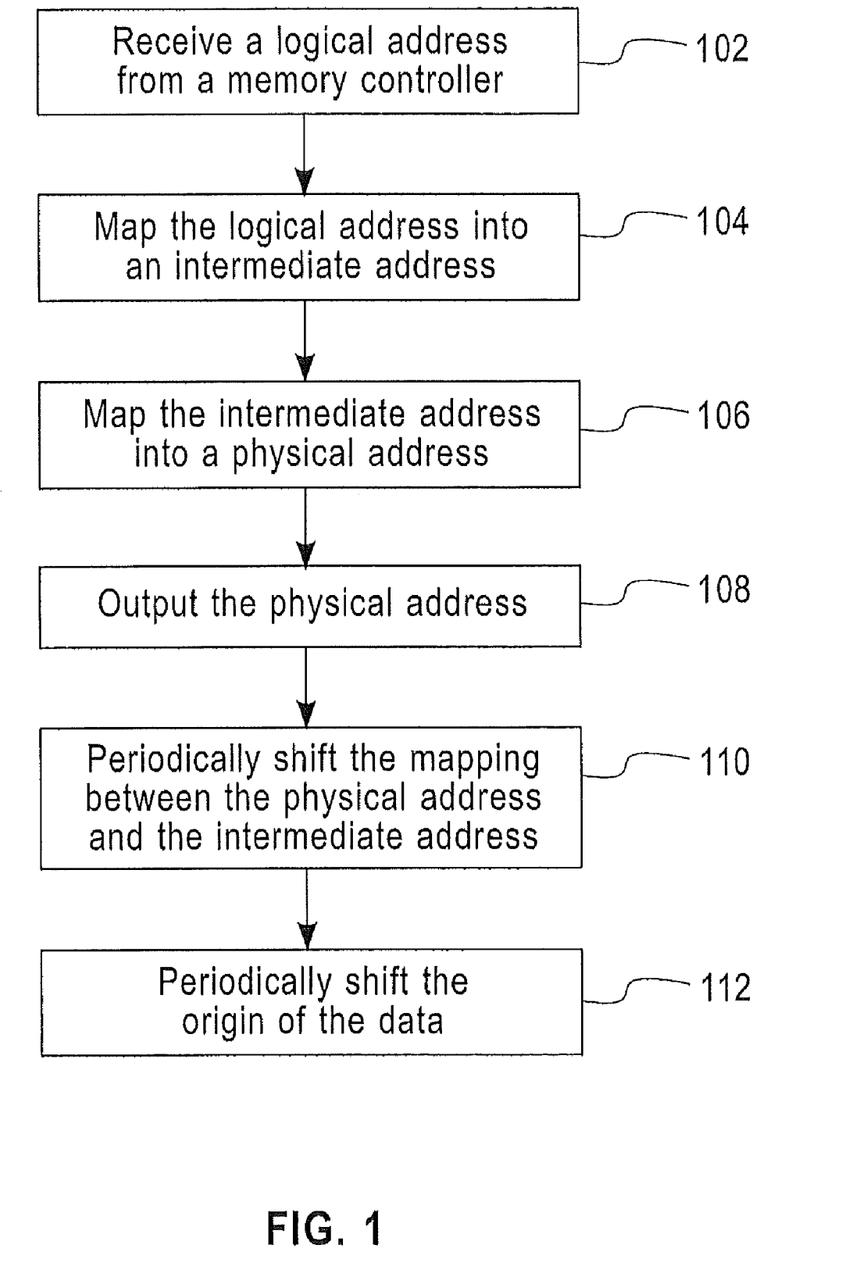
FIG. 1 illustrates a process for performing wear-leveling of memory devices that may be implemented by an exemplary embodiment.

FIG. 1 illustrates a process for performing wear-leveling of memory devices that may be implemented by wear-leveling logic in an exemplary embodiment. At block 102, a logical address is received from a processor. The processor sends a "real address" that is received by the wear-leveling logic as a "logical address". At block 104, the logical address is mapped into an intermediate address. In an exemplary embodiment, this mapping includes application of a randomizing mapping function between a range of logical addresses and a range of intermediate addresses. Examples of randomizing functions that can be used include, but are not limited to reversing the logical address bits, and permuting the logical address bits. The purpose is to spread nearby logical addresses across a broad range of intermediate addresses so that frequently accessed blocks of near-contiguous logical addresses become substantially diffused throughout the intermediate address space. It may be advantageous to prevent the randomizing function from being detectable (e.g., to prevent hackers). To this end, in an exemplary embodiment, the randomizing function is based on selecting, at power-up time, a random permutation of at least some of the logical address bits.

At block 106 in FIG. 1, the intermediate address is mapped into a physical address. The range of intermediate addresses map to a range of physical addresses which is at least one unit larger than the range of intermediate addresses. In an exemplary embodiment, this is performed using a circular physical address buffer where a start address defines the physical location corresponding to the lowest logical address, and where a gap address defines the location of an additional address location which is not necessarily mapped to a particular intermediate address. With this simple circular mapping, the physical address is computed from the intermediate address by adding the start address to the intermediate address; and then if the resulting physical address is equal to or larger than the gap address, the physical address should be incremented by one unit so as to "skip over" the gap address. At block 108, the physical address is output and utilized in a memory access.

At block 110, in FIG. 1, the mapping between the intermediate addresses and the physical addresses are periodically (e.g., once in every selected time interval, once after every selected number of accesses, etc.) shifted over time. In an exemplary embodiment, the shifting is performed using a series of rotational shifts repeatedly copying physical address contents into the gap address location while keeping track of the gap address location and any other information required to maintain the correct mapping between intermediate addresses and physical addresses. In an exemplary implementation, the contents of the physical location adjacent to the current gap address are copied into the memory at the gap address, a new gap address is set to the physical location from which the data was just copied, and then the process is repeated. The copying can be done one unit at a time, or in larger blocks if the gap address is larger than one unit. In addition, the copying can be done at fixed intervals, or grouped into bursts of copying activity.

At block 112, the origin of the data (i.e., the lowest-order or highest-order bit location) written into each memory location (e.g., each memory block) is periodically shifted across the stored content so as to average out any local wear variations in different regions of written data. In an exemplary embodiment, this is performed by circularly shifting the lowest-order bit location by a known amount each time data is copied into the gap location. In this manner, the lowest-order bit location can be directly calculated using the start address and the gap address. In other exemplary embodiments, where the origin offset is not always calculable directly from the start address, an origin offset is recorded.

Figure 2:
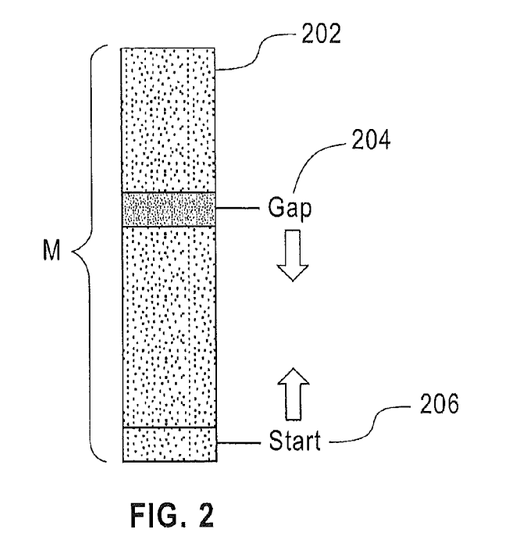
FIG. 2 illustrates a block diagram of physical memory that may be implemented by an exemplary embodiment.

FIG. 2 illustrates a block diagram of a physical memory that may be implemented by an exemplary embodiment to perform the processing described above with reference to blocks 106 and 110 of FIG. 1. The physical memory 202 depicted in FIG. 2 contains M locations and the intermediate memory addresses span M-1 locations. Each physical memory 202 may be implemented by one or more memory devices. A start address 206 is stored in a start register and a gap address 204 is stored in a gap register. The start register and the gap register each contain an address of one of the locations (e.g., memory blocks) in the physical memory 202. The start address 206 corresponds to the intermediate memory start address "0", and the gap address 204 corresponds to a physical address that may contain a copy of the contents of an adjacent physical location, or may contain no useful data.

In an exemplary embodiment, the gap address 204 is periodically decremented by one unit, modulo M. When the gap address 204 becomes equal to the start address 206, the start address 206 is incremented by one unit, modulo M. In this embodiment, the gap address 204 changes faster than the start address 206, as the start address 206 is incremented only when the start address 206 equals the gap address 204. For every M moves of the gap address 204, the start address 206 increments by one. Before decrementing the gap address 204, the contents of the memory block below the gap address 204 are copied in to the location specified by the gap address 204 (i.e., the data is shifted). After M moves of the gap address 204, all of the data in the memory 202 will have shifted up by one block.

An exemplary embodiment of this process can be described by the following pseudo-code:

```
H = GAP-1 mod M
copy data from H to GAP (copy data below the gap address into the gap address)
GAP = H (decrement the gap address)
if GAP == START then
    START = START+1 mod M (increment start address)
```

Given that the contents of gap and start registers are continuously changing, the mapping of intermediate addresses to physical memory addresses also change. The mapping is accomplished by the following pseudo-code, which may be implemented in hardware using few arithmetic-logic gates:

```
if GAP < START then
    GAP' = GAP+M
else
    GAP' = GAP
if START+INTERMEDIATE ADDRESS (IA) >= GAP' then
    PHYSICAL ADDRESS (PA) = (START+IA+1) mod M
else
    PA = (START+IA) mod M
return PA
```

Note that moving the gap address incurs a write (i.e., copying data from the address below the gap address into the gap address). Ideally, the start address and the gap address should move fast enough to spread hot spots across the entire memory over the expected lifetime of the memory. In addition, the GAP address should move slowly enough to not incur too many writes. In an exemplary embodiment, the GAP address is incremented on every Nth write to the memory; e.g. if N=100, then 1% of the wear will be due to moving of the GAP address.

As stated before and as described in reference to block 112 of FIG. 1, horizontal wear-leveling, or leveling wear across the bytes of a block, is provided by cycling the origin location of the written block (i.e., the most significant bit location) across the group of chips used to store the block. When the data is written to a new location by shifting the gap location, the starting position is also shifted by a fixed number of bits to the right. Then, in an exemplary embodiment, the horizontal starting position is determined from the contents of a rotate register, and the location of the memory reference relative to the gap.

Figure 3:
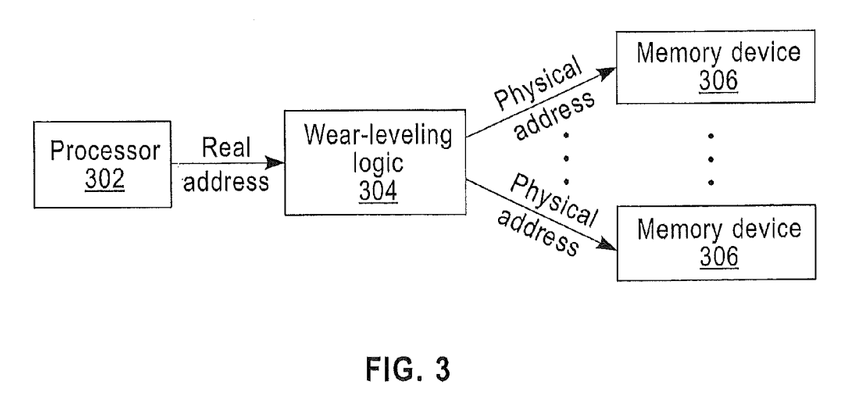
FIG. 3 illustrates a block diagram of a memory system for performing wear-leveling that may be implemented by an exemplary embodiment.

FIG. 3 illustrates a block diagram of a memory system for performing wear-leveling that may be implemented by an exemplary embodiment. The system depicted in FIG. 3 includes a processor 302, wear-leveling logic 304 (such as the logic depicted in FIG. 1) and one or more memory devices 306. In an exemplary embodiment, the processor 302 generates real addresses that are input to the wear-leveling logic 304 (also referred to herein as a wear-leveling module). The wear-leveling logic 304 receives the real addresses as logical addresses. The wear-leveling logic 304 may be implemented in hardware and/or software and may be located in any location that is accessible by the processor 304 such as, but not limited to the processor 304, a memory controller, and a hub device on a memory module. The wear-leveling logic 304 outputs physical addresses that may be utilized to access a block of data spread across one or more memory devices 306.

FIG. 3 illustrates the addresses being transmitted between the processor 302, the wear-leveling logic 304 and the memory devices 306. As is known in the art, other information such as data and commands may also be communicated between these components in order to support memory access operations. Though not shown in FIG. 3, other elements, such as a memory module and/or a memory controller may also be required to support memory operations.

Figure 4:
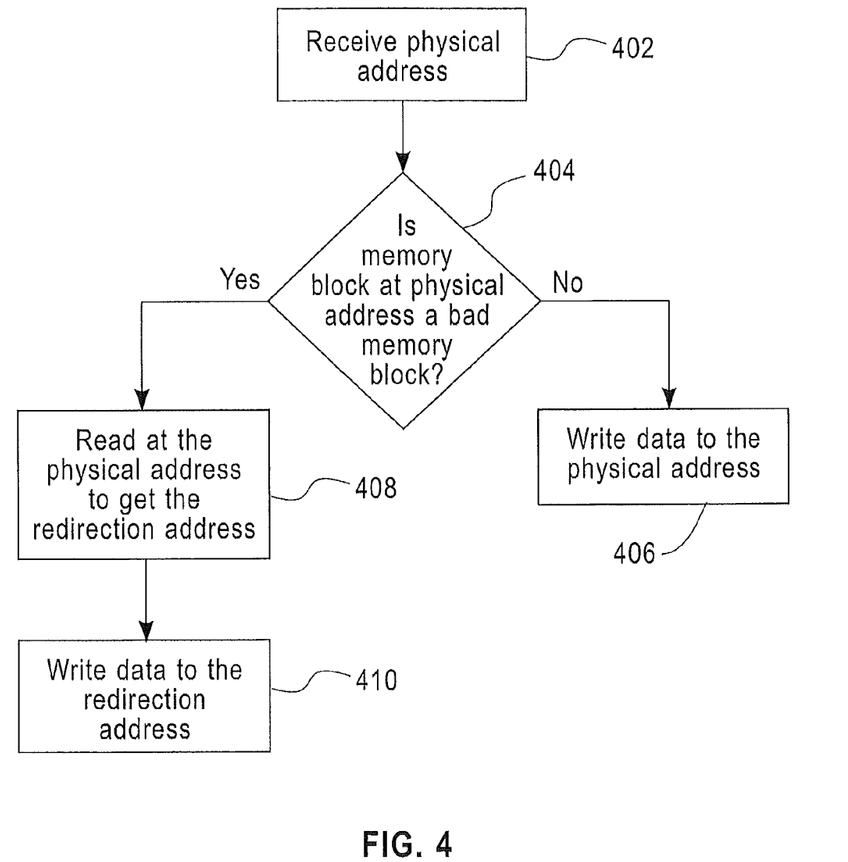
FIG. 4 illustrates a process for performing a data write using bad block management and a fast lookup directory that may be implemented by an exemplary embodiment.

FIG. 4 illustrates a process for performing a data write with bad block management that may be implemented by an exemplary embodiment of bad block management software. In an exemplary embodiment, when a data loss potential is detected (i.e., a bad block may arise) due, for example, to running out of redundant bits in the block, then the data from the bad block is copied in to a spare block kept elsewhere in the memory. One or more copies of a redirection address pointing to the spare block are written to the memory block with the data loss potential (also referred to as the partially good block). In an exemplary embodiment, addresses of the spare blocks are much shorter than the block data lengths. For example, a one terabyte (TB) memory with a one kilobyte (KB) block size may be addressed with thirty bits (or about four bytes). Thus, even if half of the bits in a memory block are bad, sufficient good bits will remain in the 1,024 bits to be able to extract a good thirty bit block address. In an exemplary embodiment, one or more bits may be encoded in the block indicating the length and/or type of the written information. Reads to bad blocks will detect the bits indicating that a redirection is required, and then the short but very heavily redundantly encoded address information in the block will be used as the redirection address.

Referring to FIG. 4, at block 402, a physical address of a memory block, is received. At block 404, it is determined if the memory block at the physical address is a potentially bad memory block. A consequence of the bad block management scheme is that when writing to a bad memory block, a read-before-write operation may be necessary as it is not known ahead of time if a memory block is bad or not. To workaround this limitation, an exemplary embodiment uses a Bloom filter (one example of a fast lookup directory that may be utilized by exemplary embodiments) which is a space efficient hardware based directory that implements a probabilistic data structure. Using the Bloom filter eliminates the need to first read the data at a physical address to ensure that it can actually hold the desired data and is not instead being used to hold a redirection address, before writing new data into it. This could be done with a variety of traditional directory look-up approaches, but many such approaches are relatively slow, and since the number of bad blocks could grow very large, the size of a directory keeping track of bad block addresses could get excessively large.

In an exemplary embodiment a hardware Bloom filter (i.e., multiple independent hashing functions with single-bit output flags which can be set to flag a potential bad block) is utilized to flag all bad blocks with a minimum of false positives. Although some amount of falsely flagging memory blocks as bad memory blocks will occur, this will only result in a small amount of additional reads-before-writes. Even if the number of bad memory blocks grows well beyond the expected size which can be handled well by a given Bloom filter size, the performance of the system will never be worse than the case without a filter (i.e., the worst case is where every write requires a read-before-write).

In exemplary embodiments, bad memory blocks are detected by evaluating the ECC characteristics of redundantly coded data stored into each physical memory address. In an exemplary embodiment, the ECC is checked during each copying of the data into the gap address and any physical address location whose ECC results fall below some acceptability threshold is marked as faulty.

If it is determined, at block 404, that the memory block at the physical address is not bad, then block 406 is performed and data is written to the memory block specified by the physical address.

If it is determined, at block 404, that the memory block is a potentially bad memory block, then processing continues at block 408 where a read to the physical address is performed. At block 410 it is determined if contents of the physical address include a redirection address. In an exemplary embodiment the type of contents are determined on a value of one or more indicator bits also stored at the physical address. In an exemplary embodiment, the redirection address length is fixed and a single bit is utilized to determine whether the contents of the block are data or a redirection address. In an alternate exemplary embodiment, two or more bits are encoded which indicate the data that is contained at the memory block. Examples of different types of data include, but are not limited to: a full data line (typically >1000 bits); a long redirection address of 64 bits for example, a medium redirection address of, 20-32 bits for example, and in the case of an extremely damaged bad memory block a very short redirection address of 10 bits or less in length. By using the longer addresses first, the shortest redirection addresses can be saved for the very end of life of the memory system, when some blocks could become so badly worn that their capacity shrinks dramatically. In an exemplary embodiment, if the memory block contains data and not a redirection address, then processing continues at block 406 and the data is written to the physical address. If the memory block contains a redirection address, then block 412 is performed and the data is written to the redirection address.

In some cases, the memory block is not known to be bad until an attempt is made to write data to the memory block. In this case, the bad block management logic selects a spare block from a pool of spare blocks, writes the address of the selected spare block to the bad memory block, and writes the data to the spare block. In addition, one or more flags indicating that the block is bad is sent to the Bloom filter.

Figure 5:
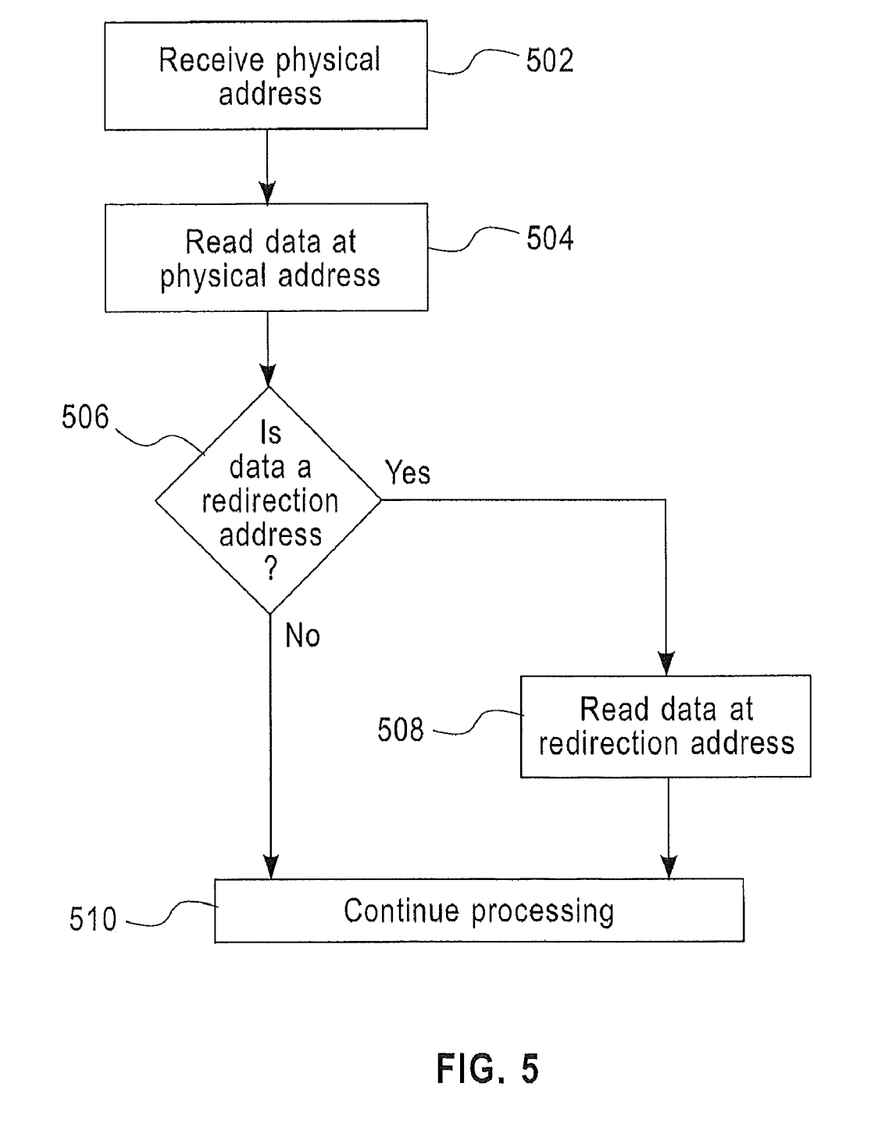
FIG. 5 illustrates a process for performing a data read with bad block management that may be implemented by an exemplary embodiment.

FIG. 5 illustrates a process for performing a data read with bad block management that may be implemented by an exemplary embodiment of the bad block management logic. At block 502, a physical address is received and at block 504, a read is performed at the physical address. At block 506, it is determined if the block at the physical address contains data or a redirection address. As described previously, this may be determined based on the contents of one or more bits in the block. If the memory block contains a redirection address, then block 508 is performed and a read is performed at the redirection address and then block 510 is performed where processing is continued (e.g., the data is returned to a requestor or stored in a queue). If the memory block contains data, then block 510 is performed and processing is continued.

In an alternate exemplary embodiment, a fast lookup directory, such as a Bloom filter, is utilized to determine if the physical address received at block 502 is a potential bad block. If the block is not a potential bad block, then processing continues at block 504. If the block is a potential bad block, then a redirection address is algebraically calculated. In an exemplary embodiment, each set of ten or one hundred or another selected number of blocks map algebraically to a single redirection address. The blocks at the redirection addresses will include data along with additional bits to indicate the block that was redirected to the redirection address. For example, if ten blocks map to the redirection address, four bits may be required to indicate which, if any, of the blocks are currently using the redirection address. A read is performed at the algebraically calculated redirection address. If the bits indicate that the data corresponds to data intended to be stored in the received physical address, then processing continues at block 510. If the bits indicate that the data does not correspond to data intended to be stored n the received physical address, then processing continues at block 504. One or more processes described in this alternate exemplary embodiment may be performed in parallel with the processes described in reference to FIG. 5. For example, block 504 may be performed in parallel with determining if the physical address is a bad block and algebraically calculating the redirection address.

Figure 6:
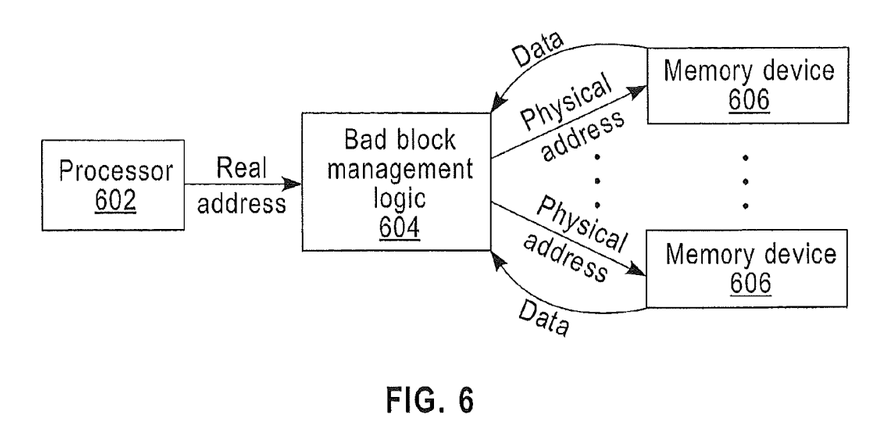
FIG. 6 illustrates a block diagram of a memory system for performing bad block management that may be implemented by an exemplary embodiment.

FIG. 6 illustrates a block diagram of a memory system for performing bad block management that may be implemented by an exemplary embodiment. The system depicted in FIG. 6 includes a processor 602, bad block management logic 604 (such as that depicted in FIGS. 4 and 5) and one or more memory devices 606. In an exemplary embodiment, the processor 602 generates real addresses that are input to the bad block management logic 604 (also referred to herein as a bad block management module). The bad block management logic 604 receives the real addresses as logical addresses. The bad block management logic 604 may be implemented in hardware and/or software and may be located in any location that is accessible by the processor 604 such as, but not limited to the processor 604, a memory controller, and a hub device on a memory module. The wear-leveling logic 604 outputs physical addresses and receives data from memory blocks that may be spread across one or more memory devices 606.

FIG. 6 illustrates the addresses and selected data being transmitted between the processor 602, the bad block management logic 604 and the memory devices 606. As is known in the art, other information may also be communicated between these components in order to support memory access operations. Though not shown in FIG. 6, other elements, such as a memory module and/or a memory controller may also be required to support memory operations.

Figure 7:
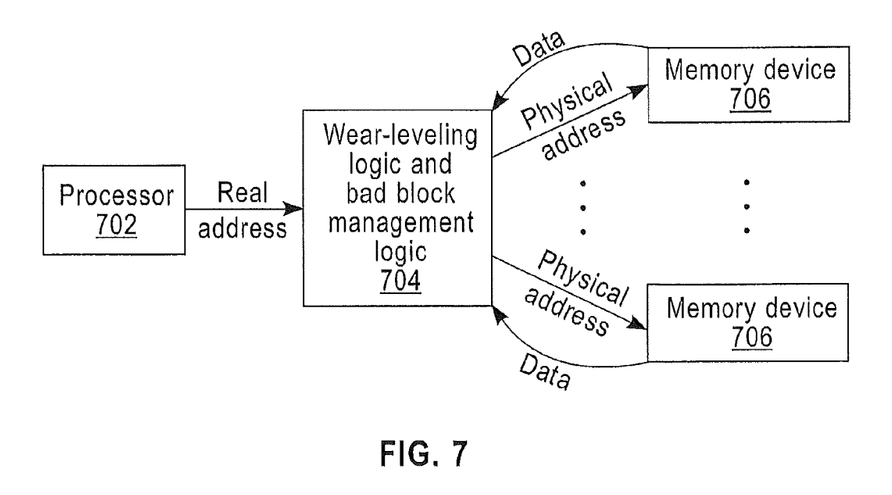
FIG. 7 illustrates a block diagram of a memory system for performing wear-leveling and bad block management that may be implemented by an exemplary embodiment.

FIG. 7 illustrates a block diagram of a memory system for performing wear-leveling and bad block management that may be implemented by an exemplary embodiment. The system depicted in FIG. 7 includes a processor 702, wear-leveling logic 704 and bad block management logic 708 and one or more memory devices 706. In alternate exemplary embodiments, the wear-leveling logic 704 and the bad block management logic 708 are not co-located in the same module as depicted in FIG. 7.

Technical effects and benefits include the ability to provide wear-leveling without requiring the overhead of lookup tables. This avoids having to keep memory space available for a table, removes the need for table bookkeeping, and removes access delays caused by having to access a table before each memory access. Technical effects and benefits also include providing bad block management in a manner that does not require a read before each write.

The terminology used herein is for the purpose of describing particular embodiments only and is not intended to be limiting of the invention. As used herein, the singular forms "a", "an" and "the" are intended to include the plural forms as well, unless the context clearly dictates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to includes any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The flow diagrams depicted herein are just one example. There may be many variations to this diagram or the steps (or operations) described therein without departing from the spirit of the invention. For instance, the steps may be performed in a differing order or steps may be added, deleted, or modified. All of these variations are considered a part of the claimed invention.

As described above, the embodiments of the invention may be embodied in the form of computer-implemented processes and apparatuses for practicing those processes. Embodiments of the invention may also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for performing, in a memory system, the method comprising:
   receiving logical memory addresses;
   applying a randomizing function to the logical memory addresses to generate intermediate addresses within a range of intermediate addresses;
   mapping the intermediate addresses into physical addresses of a memory using an algebraic mapping, the physical addresses within a range of physical addresses that include at least one more location than the range of intermediate addresses; said mapping performed using a circular buffer having a physical address location and a gap address location not mapped to said intermediate address locations; outputting the physical addresses for accessing the memory; periodically shifting the mapping between the intermediate addresses and the physical addresses; detecting a bad block in the memory; and redirecting references to the bad block, the redirecting including storing a redirection address and one or more indicator bits indicating that the bad block includes the redirection address, the redirection address specifying a memory block containing data intended for the bad block, wherein memory access requests to the bad block are directed to the redirection address.

2. The method of claim 1, wherein the detecting a bad block outputs a flag to a fast lookup directory to indicate that the bad block has been detected, and the fast lookup directory is utilized during memory writes to reduce a number of required reads before the memory writes; and said circular buffer has a start address corresponding to a lowest logical address.

3. A method for performing bad block management in a memory system, the method comprising:
   detecting a bad block in the memory;
   redirecting references to the bad block, the redirecting including storing a redirection address and one or more indicator bits indicating that the bad block includes the redirection address;
   the redirection address specifying a memory block containing data intended for the bad block, wherein memory access requests to the bad block are directed to the redirection address; and
   reading the block contents to determine if the block contains data or redirection address using address length and indicator bits.

4. The method of claim 3, wherein the redirecting further includes algebraically calculating the redirection address and the redirection address further specifies a physical address corresponding to contents of the redirection address.

5. The method of claim 3, wherein the detecting utilizes error code correction (ECC) results to flag potentially bad blocks.

6. The method of claim 3, wherein the detecting a bad block outputs a flag to a fast lookup directory to indicate that the bad block has been detected.

7. The method of claim 6, further comprising:
   receiving a write command to a physical address in the memory;

utilizing the fast lookup directory to determine if a memory block at the physical address is a potential bad block;

writing to the physical address in response to determining that the memory block is not a potential bad block; and in response to determining that the memory block is a potential bad block: reading the physical address to determine if contents of the physical address include a redirection address;

writing to the redirection address in response to determining that contents of the physical address include the redirection address; and writing to the physical address in response to determining that the contents of the physical address do not include a redirection address.

8. The method of claim 3, wherein the redirection address is a highly redundant encoded address of variable length and includes flag bits to indicate the length of the redirection address or data.

9. A method for performing bad block management in a memory system, the method comprising:

detecting a bad block in the memory by outputting a flag to a fast lookup directory to indicate that the bad block has been detected and wherein the fast lookup directory is a Bloom filter; and redirecting references to the bad block, the redirecting including storing a redirection address and one or more indicator bits indicating that the bad block includes the redirection address, the redirection address specifying a memory block containing data intended for the bad block, wherein memory access requests to the bad block are directed to the redirection address.

10. A memory system comprising:

a memory including one or more limited lifetime memory devices;

a wear-leveling module connected to a processor and to the memory, the wear-leveling module configured for:

receiving logical memory addresses from the processor;

applying a randomizing function to the logical memory addresses to generate intermediate addresses within a range of intermediate addresses;

mapping the intermediate addresses into physical addresses of the memory using an algebraic mapping, the physical addresses including at least one more location than the range of intermediate addresses;

outputting the physical addresses for accessing the memory; and periodically shifting the mapping between the intermediate addresses and the physical addresses; and a bad block module configured for:

detecting a bad block in the memory; and redirecting references to the bad block, the redirecting including storing a redirection address and an indicator bit in the bad block, the indicator bit indicating that the bad block includes the redirection address, the redirection address specifying a memory block containing data intended for the bad block, wherein memory access requests to the bad block are directed to the redirection address, and redirection address length and the indicator bits are utilized to determine whether contents of the blocks are data or redirection address.

11. The memory system of claim 10 further comprising a fast lookup directory, and the bad block management module is further configured for: receiving a write command to a physical address;

utilizing the fast lookup directory to determine if a memory block at the physical address is a potential bad block;

writing to the physical address in response to determining that the memory block is not a potential bad block; and in response to determining that the memory block is a potential bad block:

reading the physical address to determine if contents of the physical address include a redirection address;

writing to the redirection address in response to determining that contents of the physical address include the redirection address; and writing to the physical address in response to determining that contents of the physical address do not include a redirection address.

12. A memory system comprising:

a memory including one or more limited lifetime memory devices; and a bad block management module configured for:

detecting a bad block in the memory;

redirecting references to the bad block, the redirecting including storing a redirection address and an indicator bit in the bad block, the indicator bit indicating that the bad block includes the redirection address, the redirection address specifying a memory block containing data intended for the bad block, wherein memory access requests to the bad block are directed to the redirection address; and reading the block contents to determine if the block contains data or redirection address using address length and indicator bits.

13. The memory system of claim 12 wherein another read operation is performed on the block when it contains a physical redirection address, further comprising a fast lookup directory, and the bad block management module is further configured for: receiving a write command to a physical address;

utilizing the fast lookup directory to determine if a memory block at the physical address is a potential bad block;

writing to the physical address in response to determining that the memory block is not a potential bad block; and in response to determining that the memory block is a potential bad block:

reading the physical address to determine if contents of the physical address include a redirection address;

writing to the redirection address in response to determining that contents of the physical address include the redirection address; and writing to the physical address in response to determining that contents of the physical address do not include a redirection address.

* * * * *